US007685540B1

(12) United States Patent
Madden et al.

(10) Patent No.: US 7,685,540 B1
(45) Date of Patent: Mar. 23, 2010

(54) STANDARD BLOCK DESIGN: AN EFFECTIVE APPROACH FOR LARGE SCALE FLOORPLANNING

(75) Inventors: Patrick H. Madden, Owego, NY (US); Ameya R. Agnihotri, Santa Clara, CA (US)

(73) Assignee: The Research Foundation of the State University of New York, Binghamton, NY (US)

( * ) Notice: Subject to any disclaimer, the term of this patent is extended or adjusted under 35 U.S.C. 154(b) by 405 days.

(21) Appl. No.: 11/744,208

(22) Filed: May 3, 2007

(51) Int. Cl.
*G06F 17/50* (2006.01)
(52) U.S. Cl. .................. 716/2; 716/1; 716/12; 716/17
(58) Field of Classification Search .................. 716/1, 716/2, 12, 17
See application file for complete search history.

(56) References Cited

U.S. PATENT DOCUMENTS 6,536,028 B1 * 3/2003 Katsioulas et al. ............ 716/17

OTHER PUBLICATIONS

A. Khatkhate, C. Li, A. R. Agnihotri, M. C. Yildiz, S. Ono, C.-K. Koh, and P. H. Madden, "Recursive Bisection Based Mixed Block Placement," to appear International Symposium on Physical Design, Apr. 2004.
S. N. Adya, I. L. Markov, P. G. Villarrubia, P. Parakh, M. C. Yildiz, and P. H. Madden, "Benchmarking for Large-Scale Placement and Beyond,", International Symposium on Physical Design, Apr. 2003, pp. 95—.
P. H. Madden, "Reporting of Standard Cell Placement Result," IEEE Trans. Computer Aided Design of Integrated Circuits and Systems, 21(2), Feb. 2002, pp. 240-247.
P. H. Madden, Reporting of Standard Cell Placement Results, Proc. Int'l Symp. on Physical Design, 2001, pp. 30-35.
Yao-Wen Chang, Tung-Chieh Chen, "Modern Floorplanning Based on Fast Simulated Annealing", ISPD'05, Apr. 3-6, 2006, San Francisco, California, USA.

* cited by examiner

*Primary Examiner*—Thuan Do
(74) *Attorney, Agent, or Firm*—Hoffberg & Associates

(57) ABSTRACT

As circuit sizes have increased, designs have become increasingly hierarchical. It is common for designs to have large numbers of macro blocks; many of these blocks are "soft," and may have variable width and height. The present invention provides an alternate method to handle designs with large numbers of blocks. Rather than approaching them as expanded floorplanning, the problems are re-cast as traditional mixed size placement, and many macro blocks are treated as standard cells. Using existing mixed size placement tools, the superior reported are obtained. First, an effective "standard block design" methodology is provided. Second, new mixed size placement legalization algorithms that are more robust than the widely-used mixed-size Tetris algorithm is presented.

20 Claims, 7 Drawing Sheets

Placement with uniform block sizes

Placement with uniform block sizes

Standard cell placement; cells are of uniform height, but varying width

Mixed size design; standard cells are intermixed with macro blocks

Floorplanning, with rectangular blocks of arbitrary width and height

Floorplanning with rectilinear blocks

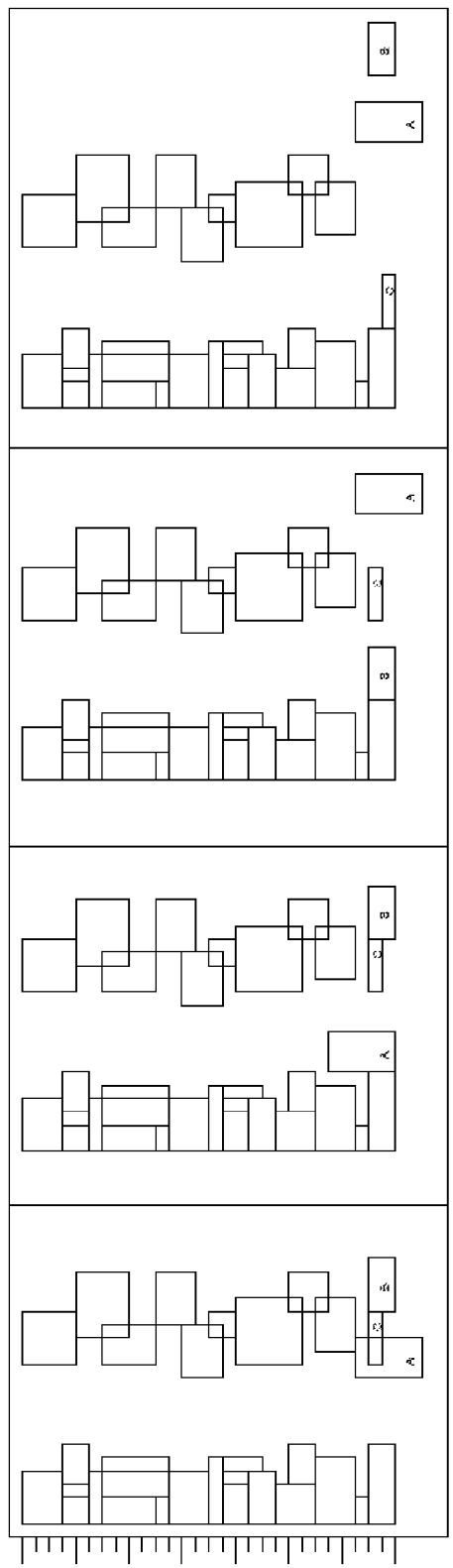

Fig. 3A

Initial legalization problem; the left edge has an arbitrary profile. Candidate blocks are considered in order.

Fig. 3B

A partial solution in which block "A" is legalized; this incurs both a displacement cost, and also a penalty for "shadowing" part of the core area.

Fig. 3C

A second partial solution, in which block "A" is deferred, and block "B" is legalized. There is no penalty for shadowing, and this partial solution can lead to the insertion of block "C" into the narrow gap in the third row.

Fig. 3D

Blocks "A" and "B" are deferred, and block "C" is legalized. While this partial solution has a low cost, it will likely be pruned later, as subsequent blocks will all cause a "shadow" of wasted space.

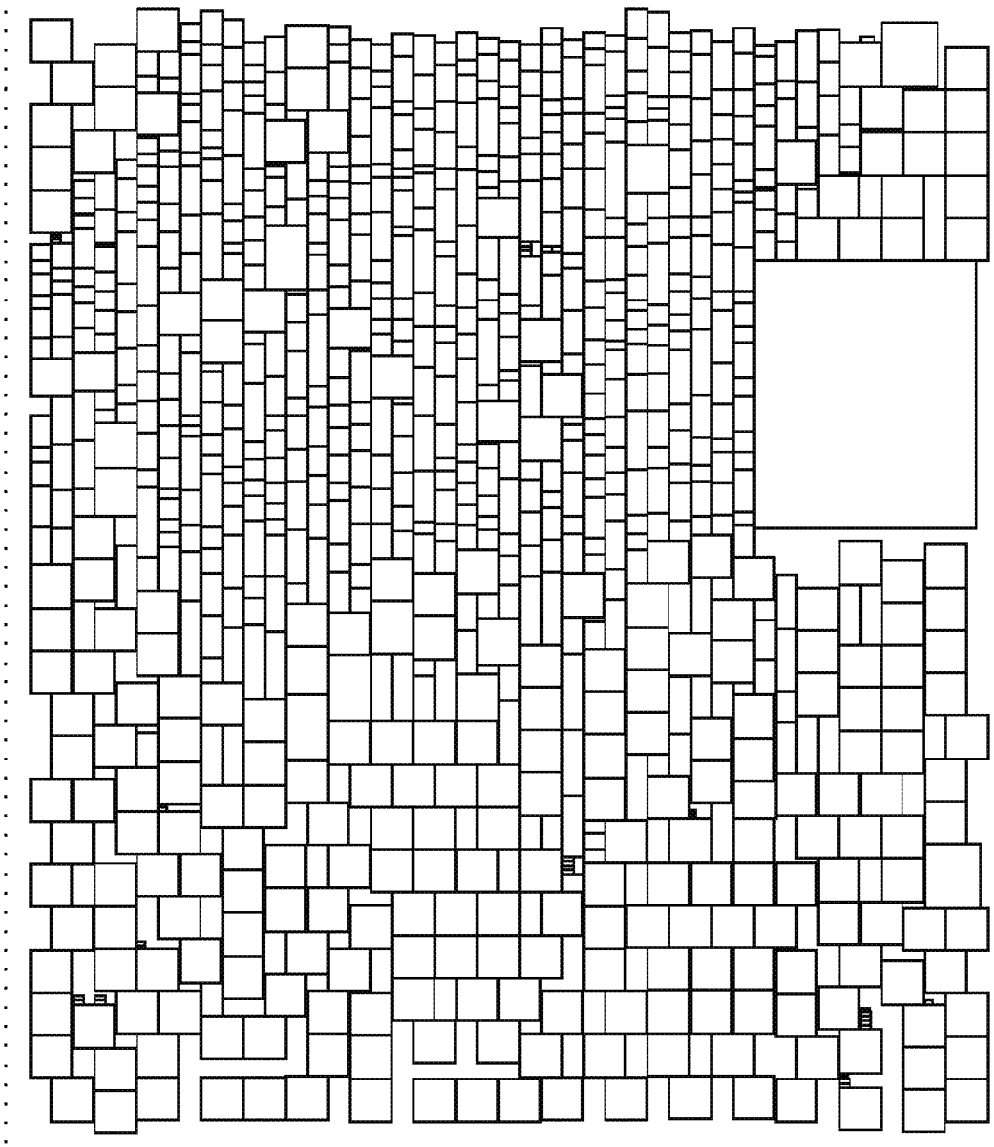
Fig. 4A feng shui 5.1 using standard block formulation

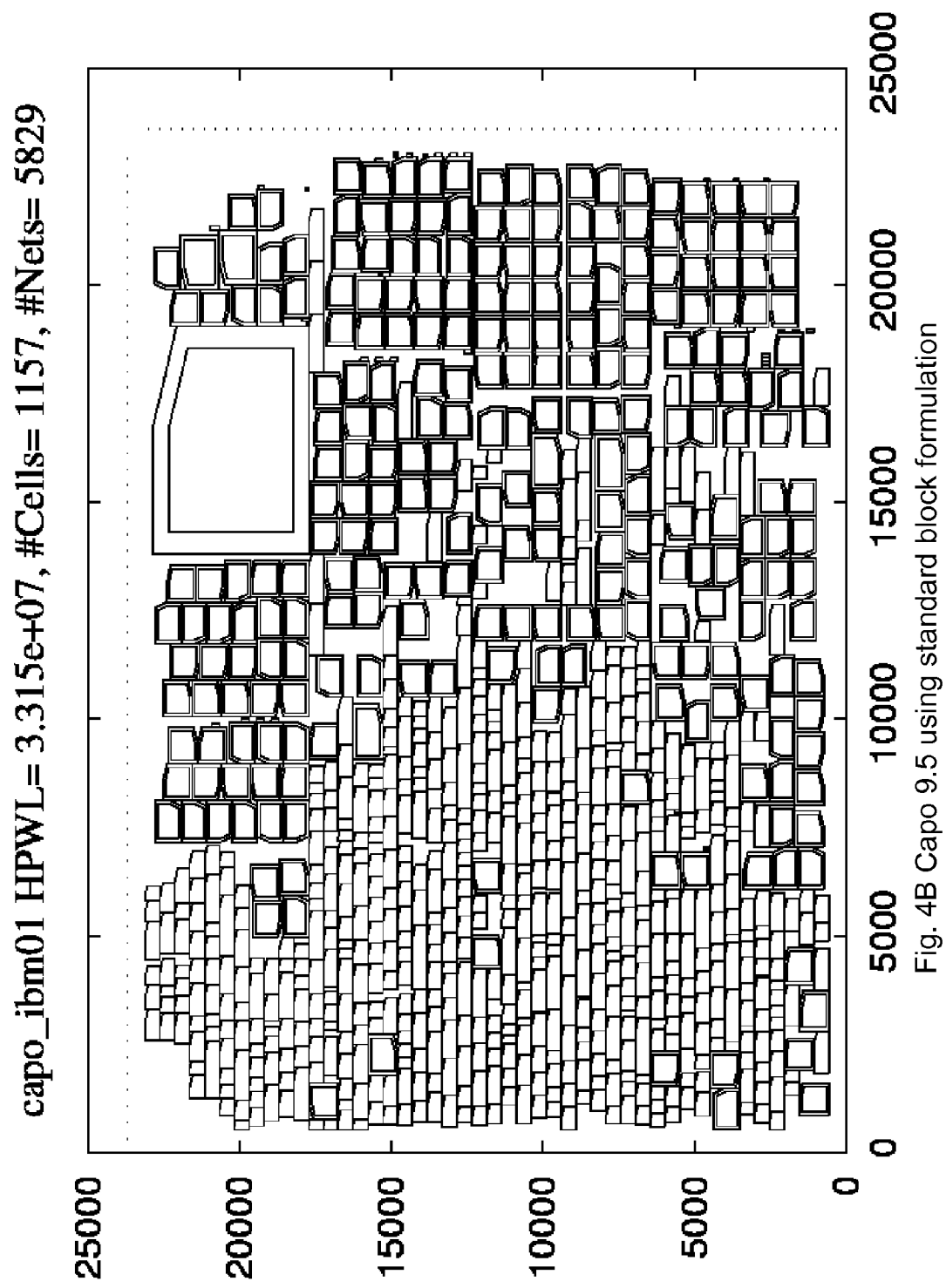
Fig. 4B Capo 9.5 using standard block formulation

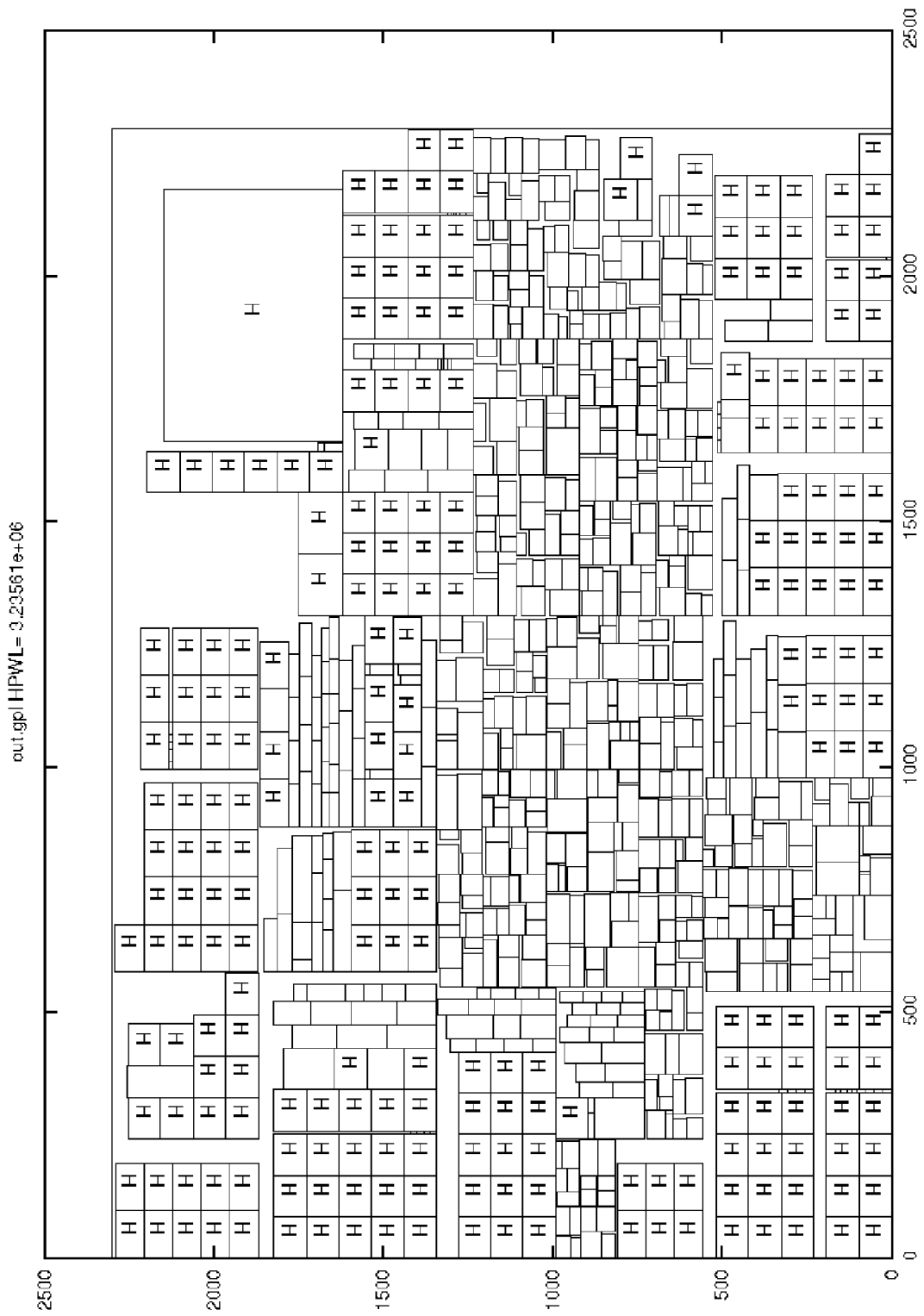
Fig. 4C PATOMA using the original floorplanning formulation

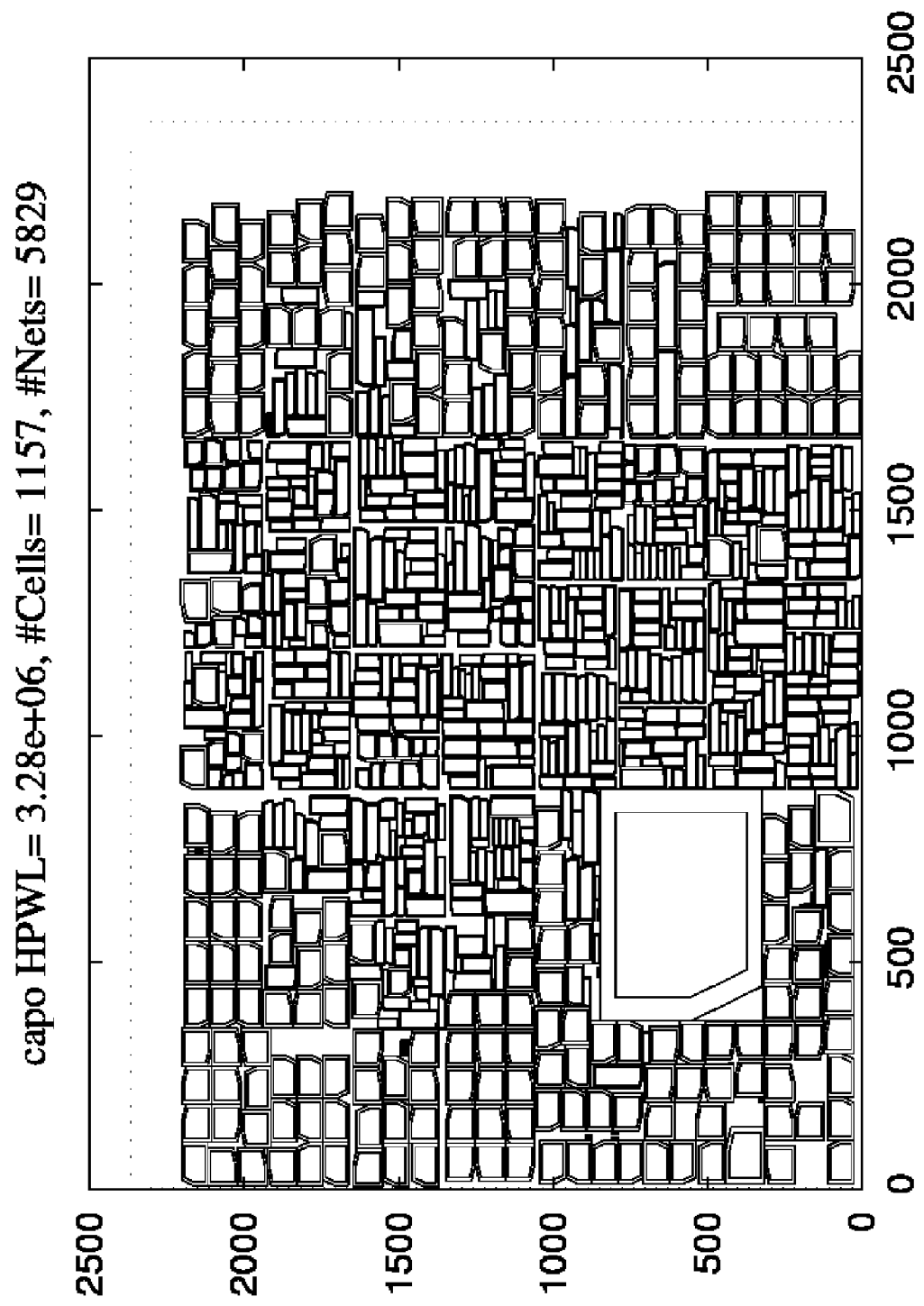
Fig. 4D Capo 9.5 placement, after automatic conversion of soft blocks to square hard blocks.

STANDARD BLOCK DESIGN: AN EFFECTIVE APPROACH FOR LARGE SCALE FLOORPLANNING

BACKGROUND OF THE INVENTION

Design sizes are continually expanding, and the task of producing a large, high performance circuit has been getting progressively more difficult. By using hierarchy, and breaking a large design into many smaller macro blocks, handling a complex project becomes somewhat more tractable. With modern chips, however, the number of blocks is now becoming unmanageable; the placement and routing of million-block designs has been identified by the industry as an important research area [15].

The optimization of placement of logical component blocks in a complex semiconductor design is difficult. The problem approaches NP completeness, and therefore the complexity of a brute force enumeration increases exponentially as the number of blocks increases. Therefore, using such an approach becomes untenable except for trivial-sized problems.

A generalized treatment of optimization technologies is provided in Tsaggouris, George, and Zaroliagis, Christos, "A Compendium of Large-Scale Network Optimisation Problems", Project Number 001907, DELIS Dynamically Evolving, Large-scale Information Systems, Integrated Project, Member of the FET Proactive Initiative Complex Systems, Deliverable D3.4.3, Initial Experimental Studies of Selected Problems (January 2006), expressly incorporated herein by reference.

Dynamic programming is also well known; for some problems, exponentially large portions of the solution space can be eliminated. If available, this provides a way to derive solutions in reasonable amounts of time. The number of problems in which this solution is available is limited—and finding such a proof is frequently difficult.

Greedy algorithms are also well known: at each step of the algorithm, a single decision is made, and the decision is based on what appears to be "best" at that stage, dependent on the limited information known at the time the decision must be committed. This approach has low run times, but produces suboptimal results in most cases.

Placement techniques have been evolving for many years; leading methods include simulated annealing, analytic methods, and recursive bisection.

Methods used for placement vary somewhat based on the size of the problem, and the nature of the objects being placed. If a design is relatively small, annealing methods can produce excellent results; many commercial tools apply annealing for local optimization, and hybrids of annealing and bisection are common.

For larger designs, analytic methods and recursive bisection both perform well; there is a clear preference for analytic placers in industrial settings. Analytic placement, and some forms of recursive bisection, require a "legalization step." Rough positions for logic elements are determined, and then exact (non-overlapping) locations are obtained as a post-processing step.

If all logic elements are of equal size or at least equal height (FIGS. 1(a) and (b)), making the design "fit" into the space available is trivial. The "standard cell" model, a cornerstone of modern design, allows for varying width, but uniform height.

When logic elements are of uniform height, many powerful local optimization techniques become available. Most placement tools perform branch-and-bound optimization of cell positions [6]. There are also methods to find optimal spacing of cells within a row [5].

For mixed size design, FIG. 1(c), we have a "boulders and dust" problem which contains both standard cells and macro blocks. For many years, this was viewed as an extremely difficult problem; in the past few years, however, great strides have been made. The recursive bisection based tool feng shui [3], and the analytic placement tools APlace [10] and UPlace [4] perform well, by first computing a non-legal abstract placement, and then performing placement legalization. feng shui and APlace both use a mixed-size Tetris legalization method. The "floorplacer" Capo [1] uses a recursive bisection framework integrated with a floorplanner. Placement legality is ensured throughout the flow.

While analytic and bisection methods are common in standard cell and mixed size design, annealing methods have dominated floorplanning. With blocks of varying width and height, it has been essential to approach the problem as one of "packing." Placement representations such as sequence pair [13] and B*-trees [7] are widely used, with an annealer being used to search the solution space.

Evaluating any particular configuration can be expensive; exchanging the positions of two blocks may disrupt an entire floorplan. Annealers can produce excellent results when given enough run time; unfortunately, the high cost of evaluating a floorplan, coupled with the size of the solution space, makes traditional methods impractical for extremely large problems.

To handle larger designs, a "floorplacement" methodology has been proposed. The placement tool PATOMA [8] performs recursive bisection, but adds a fast "legality checker" to ensure that bisection will not result in a configuration that cannot be legalized easily. PATOMA makes good use of soft macro blocks to gain greater freedom during bisection. The tool Capo [1] also utilizes a bisection framework. Capo has evolved over the years, transitioning from standard cell problems, to mixed size, and recently into floorplacement, through the integration of an annealing based floorplanner. Capo uses bisection when circuit elements are small, but switches to floorplanning when a portion of the placement contains blocks that cannot be legalized easily.

Traditional "flat" floorplanners have difficulty in scaling to handle very large designs, particularly when there are many soft macro blocks. Floorplacers handle large problems with soft blocks reasonably well.

While there has been research performed on the floorplanning of L-shaped and T-shaped blocks (shown in FIG. 1(e)), this is seldom used in industry settings. Floorplanning these shapes is fundamentally more difficult than floorplanning rectangles; the typical industry design flow avoids these shapes when possible.

SUMMARY OF THE INVENTION

The present invention provides a new methodology to handle the placement of designs with huge numbers of blocks. Rather than developing new and more complex tools, an abstraction is employed to make the problem tractable. On recent benchmarks, existing mixed size placement tools may be used to produce results that are superior to recently developed "next generation floorplacers." The present methodology can be used with any mixed size placement tool, and is easy to implement.

Placement of large designs is a key step in integrated circuit manufacturing. Legalization after analytic or fractional cut bisection is difficult, and can lose solution quality. For space allocation (for routability or gate sizing), legalization is also required. The method according to the present invention performs legalization quickly, and without increasing wire length significantly. It is more robust than many other known methods, and can handle a variety of optimization objectives.

The underlying algorithmic technique can also be used to perform detailed placement, improving solution quality of other tools. The size of the optimization window supported is a factor of ten larger than typical other methods.

For designs with hundreds or thousands of blocks, approaching the problem directly in a traditional "floorplanning" can be challenging. In modern designs, many macro blocks are "soft." They may be delivered as a netlist or as RTL code, and the precise placement of internal components has not yet been determined. In one set of recent benchmarks [8], roughly 70% of the blocks were able to be adjusted in both height and width. A set of industry designs reported in [12] contained only standard cells and soft macro blocks.

Given that the packing of arbitrarily sized rectangular blocks is a difficult problem, and that in most cases there is a great deal of freedom in determining the shape of the blocks, we make a simple observation. By selecting a "good" height (or width) to use for the blocks, the problem can be made less difficult. The problem is then reduced to one of mixed-size placement, which can be handled well by existing methods [3, 4, 10, 11].

Restricting the shape of soft macro blocks can in principle degrade the possible solution quality; however, experiments have shown that this does not occur. Thus, a preferred embodiment of the invention optimizes the placement of a set of rectangular macroblocks having uniform height (or an integral multiple of a unit macroblock standard height) and variable width.

While rectangular blocks are generally convenient, other shapes, such as unit triangular blocks, or larger macroblocks representing aggregations of the macroblocks, including hexagons and/or other polygons, may also be employed, as appropriate.

To show that it is, in fact possible to develop an acceptable "standard" height (or other unit dimension) for blocks, we first note that with soft blocks, there can be a considerable range possible. In FIG. 2, two blocks are shown; one with a total area of three units, the second with an area of twenty-seven. If we allow adjustment such that the aspect ratio is between 1:3 and 3:1, it is possible for the blocks to have equal "height." The total area ratio between them differs by a factor of nine, but they can both be treated as "cells" in a mixed size placement. While a factor of nine or more area difference between a specific pair of blocks is certainly possible, consider the case where we have hundreds or thousands of blocks. Suppose we sort the blocks by size, and compute the size ratio between them such that $r_i$ compares blocks $b_i$ and $b_i+1$. The size difference between the largest and smallest block will be the product of these $r_i$. The maximum size of any block is bounded by the chip area. With one hundred blocks, the largest block would need to be more than $9^{100}$ times larger than the smallest block before common heights could not be found. For large designs, most of the $r_i$ values will be close to unity, and a great many blocks will have areas that are within a factor of nine of each other.

One method for finding the height to use for blocks is as follows. We first scan through soft and hard blocks, to determine possible heights. These heights are either the height or width of hard blocks (assuming that rotation is allowed), and the minimum and maximum height of soft blocks. For each possible height, we evaluate the total wasted area if one were to enforce a single row height across the design. For a soft block, if it can meet the height constraint, the wasted area is zero. If it is shorter, there is wasted space (the row is taller than the block). If the block is taller, we determine the number of partial rows occupied. It is frequently the case that a soft block can be shaped to be an integral number of rows tall.

The height which results in an acceptable amount of "wasted area" and the largest total area occupied by elements that are a single "row" tall is selected. Preferably, there is no more than 5% wasted space. Once this height has been identified, a new, logically equivalent circuit is generated. All soft blocks are converted into hard blocks of an appropriate height. Traditional mixed size placement tools can then be run, rather than a floorplanning or floorplacement method.

The tools feng shui 5.1 [3] and Capo 9.5 [1] were tested with the present invention. They are widely available, and have been used extensively for benchmarking Recent analytic placement tools such as APlace [10] also handle mixed size placement well, and may produce results superior to those presented herein.

Difficulties with the "mixed size Tetris" legalization algorithm of feng shui 5.1 were observed. In many cases, the designs have large numbers of macro blocks, causing a stacking problem, with the placements almost always being illegal. The integrated floorplanner in Capo 9.5 avoided these problems.

To obtain legal results when using feng shui, we explored two different methods. The first improves on the "tetris" [9] algorithm by tracking wire length; the second uses dynamic programming to avoid insertion of dead space during legalization.

A typical goal during legalization is to minimally perturb the existing global placement. In practice, however, a placement with larger displacement might be better than a minimally displaced placement in terms of wire length.

The present invention also provides an improvement to the legalizer in Agnihotri et al. (2005) [3]. Preferably, a cost function that is a combination of displacement and sum of bounding boxes for the cell under consideration is provided. For any cell $c_i$, we have:

$$\text{cost}_i = \alpha \times d_i + \beta \times w_i$$

where, $d_i$ is the cost of displacing a cell from an initial location $l_i$ to a legal location $l_j$ and $w_i$ is the sum of bounding boxes of the nets belonging to $c_i$.

For calculating $w_i$, we divide the set of cells C into three disjoint sets: the set of legalized cells $C_l$, set $\{c_i\}$ and the set of cells that are not legalized yet denoted by $C_n$. Note that we have $C = C_l \cup \{c_i\} \cup C_n$. Let $c_j$ be any cell belonging to the nets of $c_i$. There are three possibilities:

$c_j \in C_l$. In this case, the exact legalized location of $c_j$ is used.

$c_j \in C_n$. In this case, the initial location $l_j$ of $c_j$ is used.

$c_j \in c_i$. Here all legal locations of $c_j$ in rows near $c_j$'s initial location are considered, the one picked that gives the minimum cost.

Movement of standard cells is guided by the weighted cost function described above, where as, movement of macros is guided by the displacement alone. To be specific, for standard cells, $\alpha = \beta = 1$ and for macros $\alpha = 1$ and $\beta = 0$. The strategy behind this is as follows: movement of macros can disturb the abstract placement significantly. Macros also have more nets than standard cells. Therefore, in the weighted cost function, the bounding box may dominate the displacement, resulting in the macros moving a large distance from their initial locations, solely on the basis of bounding box cost, which was experimentally verified.

Tetris-based methods can have poor performance when there is a significant amount of overlap. When there are macro blocks, insertion of a block may "shadow" a portion of the placement region, resulting in "holes" scattered throughout a design.

To describe the concept of "shadow" more precisely, consider the following simple example. Assume we have three blocks that must be legalized, that are of the sizes 1 by 1, 2 by 1, and 2 by 2. Using a Tetris-like approach, the first two blocks may be legalized into two rows. One row may have a "right edge" at position 1, while the second has a "right edge" at position 2. When legalizing the third block, a 1 by 1 empty region is created. We refer to this as a "shadow;" when employing a Tetris-like legalization approach, this empty space cannot be recovered.

For floorplanning, a common objective is to minimize the amount of wasted space; gaps between blocks are relatively large (compared to the scale of interconnect wires), and thus serve no useful purpose. Most floorplanning research therefore focuses heavily on the minimization of wasted space.

To address the shortcomings of the Tetris-based approach, a new placement legalization method was developed, based on the dynamic programming technique presented in Agnihotri et al. (2003) [2]. In the earlier work, standard cell designs were legalized in a row-by-row manner, with a set of cells being selected such that displacement was minimized.

However, in accordance with a preferred embodiment of the invention, this technique is adapted, and applied by selecting blocks to insert into rows. FIG. 3 illustrates this method. A set B of "candidate blocks" is selected, which have not been legalized, and are close to the left edge of the placement area. The blocks in B are sorted by their vertical position, and they are considered in order.

Placing block $b_i$ at into row r incurs a cost based on the displacement of block $b_i$, the amount of "shadowed area" covered by the block, the "roughness" relative to prior legalized blocks, and the degree of alignment achieved with previously legalized blocks. If a block is not selected for legalization, it incurs a displacement cost as well; this is similar to the method of Agnihotri et al. (2003) [2].

The concept of roughness can be quantified by computing the standard deviation of row lengths for a set of rows, the sum of row-to-row displacements, the difference between the maximum and minimum row lengths, or a variety of other means. The objective of the roughness metric is to prefer partial solutions with uniform row lengths, as this results in less shadowed area following the legalization of subsequent blocks.

The preferred legalization method selects cells in a "column by column" manner, in contrast to the "row by row" approach of the earlier method. The "left edge" of the placement can have an arbitrary profile, and a "right edge" is used to avoid placing blocks such that they overlap with fixed obstacles or exceed the bounds of the row. Because the size of blocks can vary greatly, only the "low spots" on the left are considered in any given pass.

Because most blocks have been adjusted to heights that are integral with the number of rows, they can frequently be legalized with relatively little wasted space.

A fundamental computer science problem is optimizing the contents of a "knapsack;" given a set of items, each with distinct values and weights. The objective is to select a subset items, maximizing value under a weight constraint. The "0-1" variant of this problem is well known to be NP-Complete [16], while a "fractional" variant can be solved easily in polynomial time.

In the fractional knapsack problem, we are allowed to take as much or as little of each item as we desire. An optimal solution for the fractional problem can be found by simply repeatedly selecting the item with the best value to weight ratio, and then taking as much as possible of it.

The 0-1 knapsack problem is similar to the fractional formulation, with only one additional constraint. While we are still provided with a set of items, we must now select an item in its entirety, or leave it out completely. Without the continuity of the fractional formulation, the problem becomes effectively unsolvable (for large instances): the number of configurations that must be considered is exponential in the problem size.

While the 0-1 knapsack problem is intractable, there is in fact an extremely efficient dynamic programming solution for a special case. If we have n items, they have integer weights, and the total weight that can be contained in the knapsack is W, then the problem can be solved optimally in O(n×W). Our general purpose solver uses this basic technique.

The dynamic programming solution for the integer form of the problem is as follows. We will construct a table V which has n+1 columns and W+1 rows; this table will contain the cost of an optimal solution for portions of the problem.

The columns of the table are used to indicate subsets of items, while the rows indicate the maximum value for weights 0 to W (inclusive). The items can be considered in any order—the optimality of the approach is not affected.

We will use $v_i$ to be the value for item i, $w_i$ to be the weight of item i, and wish to find the maximum value possible. In our table, Column 0 holds the maximum value possible with no items selected—clearly, all entries in this column will be zero. Column 1 holds the maximum value possible considering only the first item; column k holds the maximum value possible for any combination of items from 1 to k. The standard dynamic programming solution fills in columns one at a time, computing the value for a new column from elements in the prior column. The equation used for computing the optimal value possible V(w,i) for any weight w and set of items 1 through i is the following:

$$V(w,i) = \max(V(w, i-1), V(w-w_i, i-1) + v_i)$$

As the algorithm operates, we find the best possible value for a given weight w and set of items. When we consider a new item, we may either skip it (with the optimal set for weight w being unchanged), or include it (with the optimal set containing the item, and the best possible solution using prior items, and the remaining weight available). See [17].

An important component of the efficient integer approach to the problem is that the weights of items are restricted. The number of rows in the table is an integer-limiting the number of solutions that must be considered. With floating point weights, obtaining an optimal solution is not possible—by quantizing the weights, however, we can obtain a solution that is near optimal with acceptable run times.

A general purpose solver may be used to optimize the block placement. For example, the solver takes as input a human-readable file, or can be accessed as a software library. It dynamically creates tables appropriately sized for the problem, performs the operations necessary to fill in each table position, and returns a set of solutions.

This approach is referred to as an "enumeration sieve." For small problems, it can perform brute force enumeration, finding an optimal solution. When clear dominance properties are available, it utilizes a dynamic programming approach, again finding an optimal solution. When there is a lack of solution dominance, the tool selects a subset of solutions to preserve-effectively becoming a greedy method, which searches through the solution space like a sieve. By adjusting the number of solutions preserved, it can easily trade run time for solution quality.

For the legalization of a placement, blocks are considered in order, from left to right (other orderings are possible). The assignment of a block to each possible position forms a partial solution; this is similar to the selection or deferment of an item in the 0-1 knapsack problem. Subsequent blocks are combined with prior partial solutions.

Internally, the solver builds trees rather than two dimensional tables as might be found in an implementation of the integer 0-1 knapsack problem. Thus, different "columns" can hold different numbers of partial solutions, and we can adjust the solver to use higher resolution quantization in areas that are more critical.

In the integer 0-1 knapsack problem, only the maximum value solution was preserved for any given weight, effectively pruning the search space. For placement legalization, there are several methods for pruning solutions. One can approximate a Pareto curve-we divide the entire set of partial solutions by certain metrics (for example, displacement cost, shadowed area, or roughness), and then quantizing these values to a smaller range; one can then select one solution (for example, the one minimum wire length) for each quantized weight. The Pareto curve can be multi-dimensional. It is also possible to distribute partial solutions across multiple computers, such that the optimization process can be performed in parallel. The solver can also preserve subsets of solutions, based on objective functions such as displacement of a macro block, the amount of "shadowed area" covered by the macro block, the "roughness" relative to prior legalized macro blocks, and the degree of alignment achieved with previously legalized blocks. As the range of values is quantized, potential optimality is traded for run time.

Solutions can also be constrained such that they meet minimum and maximum targets (for example, maximum void space). Any partial solution that fails to meet the bound can be eliminated immediately. The solver allows the specification of tables, with arbitrary numbers of dimensions. These tables can then be used within each "option" to calculate performance.

BRIEF DESCRIPTION OF THE DRAWINGS

FIG. 3: Dynamic programming based legalization; in each pass, the left boundary of the problem can have an arbitrary profile, and a set of nearby candidate blocks is considered. Each partial solution of our DP formulation is indexed by the order of the blocks, and the maximum row reached during legalization. The cost objective is displacement minimization, reduction of wasted space, alignment with existing blocks, and avoidance of jogs along the new left edge profile.

FIG. 4: Placements of the benchmark HB01, either translated to a mixed size formulation with our approach, or as the original "floorplanning" formulation.

DETAILED DESCRIPTION OF THE PREFERRED EMBODIMENTS

Figure 1A:
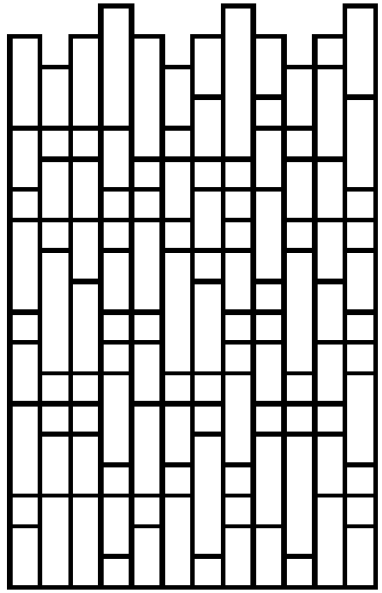
FIG. 1: Circuit placement problems come in a variety of forms. Easiest (in terms of packing and legalization) is when all blocks are of uniform size (a). (b) and (c) show standard cell and mixed size designs; cells have uniform height, making the packing problem relatively simple. (d) shows a floorplanning problem with a variety of block widths and heights; (e) shows floorplanning with arbitrary rectilinear shapes. While many commercial tools support arbitrary shapes, they are rarely seen in practice.
Figure 1B:
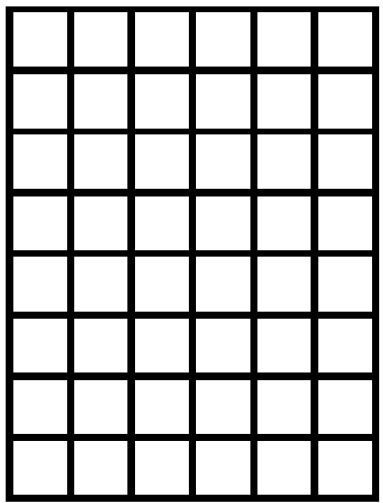
Figure 1C:
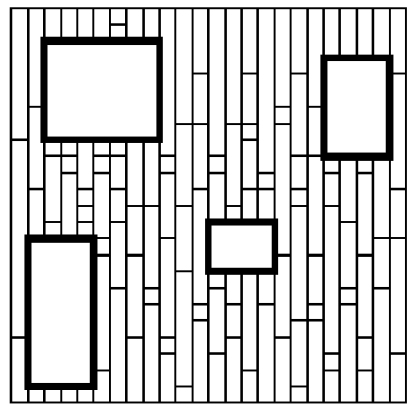
Figure 1D:
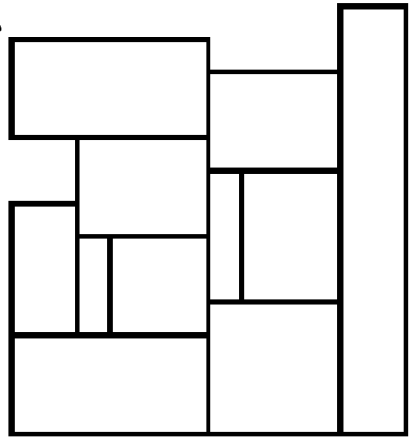
Figure 1E:
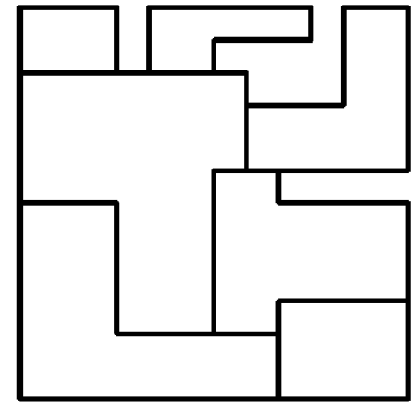
Figure 2:
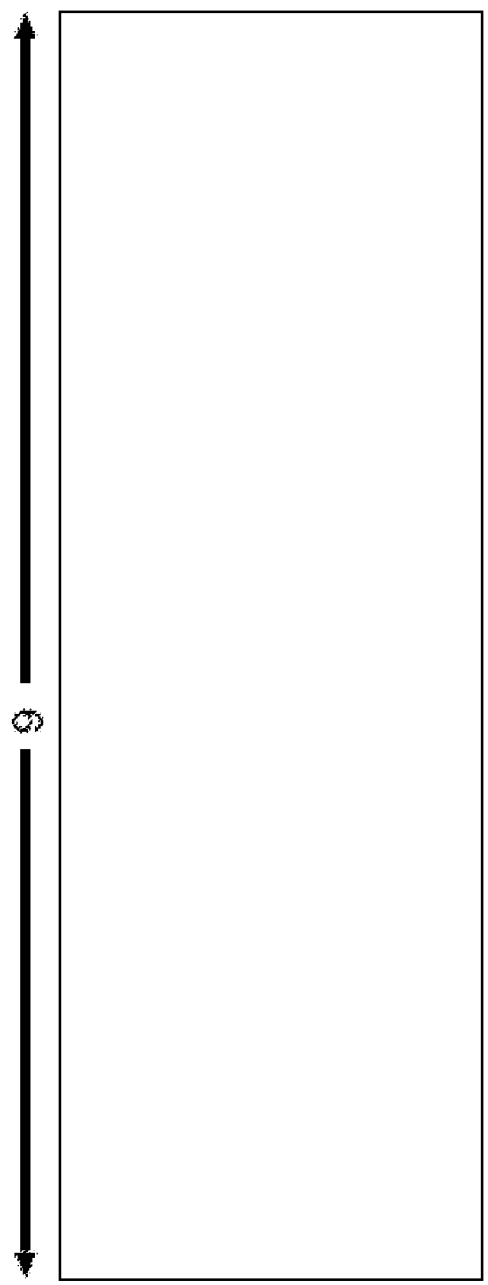
FIG. 2: When blocks are soft, and have a range of acceptable aspect ratios, there may be a considerable difference in size before it is necessary for them to have different heights or widths. If an aspect ratio of 1:3 is allowed, there can be a factor of 9 size difference between blocks placed in a "row."
Figure 2:
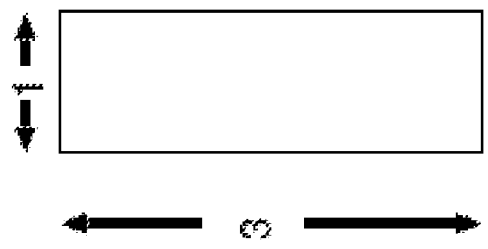

In accordance with a first embodiment of the invention, "HB" [8] placements were first converted to "standard block" formulations, using the method described. The number of soft and hard blocks in the "original" version, and the number of "cells" and "blocks" in the conversion according to the present invention, are shown in the first few columns of Table 1.

Table 1: Wire length comparisons of the "standard block" approach according to the present invention, using the mixed size placement tools feng shui 5.1, with the legalizer according to the present invention, and Capo 9.5. Capo 9.5, converts floorplanning problems into mixed size placement problems in which all soft blocks are square; these results are shown in the third wire length column. The methods of PATOMA and the floorplanner Parquet 2 are compared. For two designs, HB06 and HB15, the automatic conversion provided by Capo 9.5 resulted in overlapping (non-legal) placements.

| | Original-Benchmarks | | Standard-Block | | | Standard | Standard | Square | | |
|---|---|---|---|---|---|---|---|---|---|---|
| Bench Mark | soft blocks | hard blocks | cells | blocks | cell space | Block+ fs5.1 | Block+ Capo 9.5 | Block Capo 9.5 | Patoma | Parquet 2 |
| HB01 | 665 | 246 | 644 | 267 | 35.1 | 3.02 | 3.27 | 3.27 | 3.10 | 5.6 |
| HB02 | 1200 | 271 | 1199 | 272 | 25.6 | 6.09 | 6.02 | 8.77 | 6.42 | 15.4 |
| HB03 | 999 | 290 | 892 | 397 | 21.9 | 10.86 | 9.74 | 11.9 | 9.8 | 19.9 |
| HB04 | 1289 | 295 | 1204 | 380 | 32.1 | 9.85 | 11.9 | 11.5 | 10.0 | 28.4 |
| HB05 | 564 | 0 | 472 | 92 | 48.9 | 13.5 | 14.9 | 14.6 | 14.6 | 22.3 |
| HB06 | 571 | 178 | 730 | 19 | 45.3 | 8.95 | 8.61 | 18.6* | 8.83 | 14.3 |
| HB07 | 829 | 291 | 1105 | 15 | 60.2 | 16.7 | 15.8 | 21.1 | 17.0 | 36.7 |
| HB08 | 968 | 301 | 1254 | 15 | 54.0 | 17.7 | 17.3 | 20.7 | 18.8 | 45.1 |
| HB09 | 860 | 253 | 1025 | 88 | 42.6 | 18.3 | 19.0 | 26.5 | 18.7 | 46.2 |
| HB10 | 809 | 786 | 1409 | 186 | 22.9 | 49.2 | 54.9 | 53.9 | 53.9 | 92.7 |
| HB11 | 1124 | 373 | 1407 | 90 | 47.9 | 28.2 | 28.4 | 31.2 | 28.9 | 80.0 |
| HB12 | 582 | 651 | 843 | 390 | 8.8 | 59.4 | 60.8 | 87.3 | 58.6 | 79.1 |
| HB13 | 530 | 424 | 644 | 310 | 24.9 | 39.6 | 50.9 | 40.2 | 36.9 | 80.4 |
| HB14 | 1021 | 614 | 1336 | 299 | 48.6 | 61.2 | 72.1 | 63.8 | 66.0 | 182.8 |
| HB15 | 1019 | 393 | 1095 | 317 | 32.7 | 86.9 | 111.3 | 95.5* | 90.4 | 247.7 |
| HB16 | 633 | 458 | 799 | 292 | 22.2 | 98.7 | 130.2 | 102.1 | 103.0 | 226.6 |

-continued

| Original-Benchmarks | | | Standard-Block | | | Standard | Standard | Square | | |
|---|---|---|---|---|---|---|---|---|---|---|
| Bench Mark | soft blocks | hard blocks | cells | blocks | cell space | Block+ fs5.1 | Block+ Capo 9.5 | Block Capo 9.5 | Patoma | Parquet 2 |
| HB17 | 682 | 760 | 867 | 575 | 11.5 | 147.4 | 154.9 | 148.1 | 146.0 | 327.5 |
| HB18 | 658 | 285 | 912 | 31 | 72.4 | 72.2 | 74.3 | 75.0 | 73.2 | 175.7 |
| | | Average wirelength ratio | | | | 1.0 | 1.08 | 1.21 | 1.02 | 2.25 |

Table 1 also lists the total percentage of area that can be considered single-height "cells" in the formulation according to the present invention; note that these are in fact macro blocks, and the cell abstraction is used to enable the use of mixed-size placement tools. Even when a block cannot be adjusted to be a single row in height, it may be possible to adjust it so that it is an integral number of rows tall; in many designs, there are large areas with no wasted space, with macro blocks aligning nicely in multi-row horizontal stripes.

Two widely-available mixed size placement tools, feng shui 5.1 and Capo 9.5, are used on the converted benchmarks, and half perimeter wire lengths are reported. In almost all cases, the PATOMA placement tool, explicitly developed for the "HB" benchmarks, was outperformed by the earlier methods. From these results, it appears that the fact that many blocks are "soft" does not provide an advantage for PATOMA; if a reasonable standard block height is selected, existing methods are more than adequate.

As was noted, the default legalization method of feng shui performed poorly; in almost all cases, the placements were illegal due to stacking. Thus, only the abstract placement of feng shui is used, and then legalization performed using the methods describe herein.

While performing these experiments, it was noted that Capo 9.5 handled the original floorplanning problems in an unexpected way. It was anticipated that Capo 9.5 would perform floorplanning, using the Parquet floorplanner that had been integrated into the tool. Instead, it appears that the floorplanning problems are converted into mixed size placement, but with all macro blocks being "square." In Markov[12], the authors suggest that packing square blocks is the easiest option; however, the results herein disagree, and the experimental results show that the present standard block methodology is more effective. Capo 9.5 performs better with converted standard block files in accordance with the present invention, than with the simple "square" conversion performed natively, and is able to find legal placements for all benchmarks.

In FIG. 4, placements for the benchmark HB01 are shown, using the standard block approach according to the present invention, with both feng shui and Capo, the result of PATOMA, and the result when Capo automatically converts the problem to contain square blocks.

The methodology according to the present invention handles large designs well; for small designs, traditional floorplanning methods are still appropriate. When using many soft blocks, a good "row height" is selected. When designing hard macro blocks, a design team should consider the shapes of other objects to be placed in the same chip, and plan accordingly. Rather than allowing an explosion in the number of block sizes and shapes, it is quite beneficial to enforce consistent block heights (or integer multiples thereof) across a design. Fixing the height of macro blocks also allows the development of a library of blocks that can be interchanged more easily. There is further advantage is a preselected height, in that it will allow predetermined locations of the pins for global signal nets, improving the routing quality of designs that employ the blocks. The impact of good height selection is clear; the default choice made by Capo 9.5 for square blocks results in a significant wire length overhead, and a failure to legalize placements in some instances. The tool with the greatest degree of freedom, the Parquet floorplanner, produces by far the worst results.

Mixed size placement tools have already demonstrated great scalability [14], handling millions of cells easily; with the standard block abstraction in accordance with the present invention, these same tools can handle designs with millions of blocks. Unlike the emerging "floorplacement" methods, the use of analytic placement engines is supported, which are preferred in many industry flows.

REFERENCES

[1] S. N. Adya, S. Chaturvedi, J. A. Roy, D. A. Papa, and I. L. Markov. Unification of partitioning, placement, and floorplanning In *Proc. Int. Conf. on Computer Aided Design*, pages 550.557, 2004.

[2] A. Agnihotri, M. C. Yildiz, A. Khatkhate, A. Mathur, S. Ono, and P. H. Madden. Fractional cut: Improved recursive bisection placement. In *Proc. Int. Conf. on Computer Aided Design*, pages 307.310, 2003.

[3] A. R. Agnihotri, S. Ono, C. Li, M. C. Yildiz, A. Khatkhate, C.-K. Koh, and P. H. Madden. Mixed block placement via fractional cut recursive bisection. *IEEE Trans. on Computer-Aided Design of Integrated Circuits and Systems*, 24(5):748.761, 2005.

[4] U. Brenner and M. Struzyna. Faster and better global placement by a new transportation algorithm. In *Proc. Design Automation Conf*, pages 591.596, 2005.

[5] U. Brenner and J. Vygen. Faster optimal single-row placement with fixed ordering. In *Proc. Design, Automation and Test in Europe Conf.*, pages 117.122, 2000.

[6] A. E. Caldwell, A. B. Kahng, and I. L. Markov. Optimal partitioners and end-case placers for standard-cell layout. *IEEE Trans. on Computer-Aided Design of Integrated Circuits and Systems*, 19(11):1304.1313, 2000.

[7] Y.-C. Chang, Y.-W. Chang, G.-M. Wu, and S.-W. Wu. B*-trees: A new representation for non-slicing floorplans. In *Proc. Design Automation Conf*, pages 458.463, 2000.

[8] Cong, M. Romesis, and J. Shinnerl. Fast floorplanning by look-ahead enabled recursive bipartitioning. In *Proc. Asia South Pacific Design Automation Conf.*, 2005.

[9] D. Hill. U.S. Pat. No. 6,370,673: Method and system for high speed detailed placement of cells within an integrated circuit design, 2002.

[10] A. B. Kahng, S. Reda, and Q. Wang. APlace: a general analytic placement framework. In *Proc. Int. Symp. on Physical Design*, pages 233.235, 2005.

[11] I. L. Markov. Seeing the forest and the trees: Steiner wirelength optimization in placement. In *Proc. Int. Symp. on Physical Design*, page to appear, 2006.

[12] I. L. Markov. Solving hard instances of floorplacement. In *Proc. Int. Symp. on Physical Design*, page to appear, 2006.

[13] H. Murata, K. Fujiyoshi, S. Nakatake, and Y. Kajitani. VLSI module placement based on rectangle-packing by the sequence pair. *IEEE Trans. on Computer-Aided Design of Integrated Circuits and Systems*, 15(12):1518.1524, 1996.

[14] G.-J. Nam, C. J. Alpert, P. Villarubbia, B. Winter, and M. C. Yildiz. The ISPD2005 placement contest and benchmark suite. In *Proc. Int. Symp. on Physical Design*, pages 216.220, 2005.

[15] SRC. SRC needs document: Logical, physical, and electrical design and analysis tools, June 2004. December 2005.

[16] M. R. Garey and Johnson D. S. Computers and Intractibility: A Guide to the Theory of NP-Completeness. W.H. Freeman and Co., San Francisco, Calif., 1979. page 209.

[17] T. H. Cormen, C. E. Leiserson, and R. L. Rivest. Introduction to Algorithms. MIT Press, 1990.

What is claimed is:

1. The method of optimizing the height of a set of blocks in a circuit design, comprising the steps of:
   (a) identifying a plurality of constrained heights of blocks by examining the sizes of the blocks;
   (b) determining the number and total area of blocks that would be of unit height for the plurality of constrained heights;
   (c) selecting at least one of the plurality of constrained heights;
   (d) defining the sizes of blocks to closely fit within integer multiples of the at least one selected height;
   (e) generating an abstract placement with an automated computer; and
   (f) legalizing the abstract placement while ensuring compliance with a set of legalization rules and optimizing legalization cost, wherein said legalization cost is dependent on at least one of a displacement of a macro block, an amount of shadowed area covered by the block, the roughness relative to prior legalized blocks, and the degree of alignment achieved with previously legalized blocks.

2. The method according to claim 1, in which a library of blocks is designed to match integer multiples of a pre-selected height.

3. The method according to claim 2, in which the blocks also include predetermined pin positions to allow simplified routing.

4. The method according to claim 1, in which a subsection of an integrated circuit design utilizes blocks with optimized heights.

5. The method according to claim 1, wherein the said legalization cost is dependent on a displacement of a macro block.

6. The method according to claim 1, wherein said legalization cost is dependent on an amount of shadowed area covered by the block.

7. The method according to claim 1, wherein said legalization comprises dynamic programming.

8. The method according to claim 1, wherein said legalization comprises a greedy algorithm.

9. The method according to claim 1, wherein said legalization comprises a hybrid of dynamic programming and a greedy algorithm such that:
   blocks to be legalized are sorted left-to-right;
   each block is considered in sorted order, with a legal position being found for one block at a time;
   in the course of finding a legal position for the first block, multiple locations are considered;
   for each location considered for a block, a partial solution generated;
   for each subsequent block to be legalized, prior partial solutions are considered to identify possible legal locations;
   selecting a subset of the legal partial solutions.

10. The method according to claim 1, wherein said legalization is applied to only a portion of a design at any given time.

11. The method according to claim 1, wherein said legalization is performed right-to-left, top-to-bottom, or bottom-to-top.

12. The method according to claim 1, in which said legalization is performed on a partially legalized solution.

13. The method according to claim 1, wherein said legalization cost is dependent on the roughness relative to prior legalized blocks.

14. The method according to claim 1, wherein said legalization cost is dependent on the degree of alignment achieved with previously legalized blocks.

15. An integrated circuit, whose layout is defined by a method of optimizing the height of a set of blocks in a circuit design, said method comprising the steps of:
   (a) identifying constrained heights of blocks based on an analysis of the sizes of the blocks;
   (b) determining the number and total area of blocks that would be of unit height for the constrained heights;
   (c) selecting a constrained height;
   (d) defining the sizes of blocks to closely fit within integer multiples of the selected height;
   (e) generating an abstract placement of the blocks; and
   (f) legalizing the abstract placement of the blocks while ensuring compliance with a set of legalization rules and optimizing legalization cost, wherein said legalization cost is dependent on at least one of a displacement of a macro block, an amount of shadowed area covered by the block, the roughness relative to prior legalized blocks, and the degree of alignment achieved with previously legalized blocks.

16. The integrated circuit according to claim 15, wherein the said legalization cost is dependent on a displacement of a macro block.

17. The integrated circuit according to claim 15, wherein said legalization cost is dependent on an amount of shadowed area covered by the block.

18. The integrated circuit according to claim 15, wherein said legalization cost is dependent on the roughness relative to prior legalized blocks.

19. The integrated circuit according to claim 15, wherein said legalization cost is dependent on the degree of alignment achieved with previously legalized blocks.

20. A tangible computer readable medium, storage instruction for controlling a computer to perform and execute a method of optimizing the height of a set of blocks in a circuit design, comprising the steps of:
   (a) identifying a plurality of constrained the heights and respective areas of blocks by examining the sizes of the blocks;
   (b) determining the number and total area of blocks that would be of unit height for the plurality of constrained heights;
   (c) selecting at least one of the plurality of constrained heights;
   (d) defining the sizes of blocks to closely fit within integer multiples of the at least one selected height;

(e) generating an abstract placement; and
(f) legalizing the abstract placement while ensuring compliance with a set of legalization rules and optimizing legalization cost, wherein said legalization cost is dependent on at least one of a displacement of a macro block, an amount of shadowed area covered by the block, the roughness relative to prior legalized blocks, and the degree of alignment achieved with previously legalized blocks.

* * * * *